United States Patent [19]
Funaki et al.

[11] Patent Number: 5,635,736
[45] Date of Patent: Jun. 3, 1997

[54] MOS GATE TYPE SEMICONDUCTOR DEVICE

[75] Inventors: Hideyuki Funaki, Tokyo; Yoshihiro Yamaguchi, Urawa, both of Japan

[73] Assignee: Kabushiki Kaisha Toshiba, Kawasaki, Japan

[21] Appl. No.: 527,729

[22] Filed: Sep. 13, 1995

[30] Foreign Application Priority Data

Sep. 16, 1994 [JP] Japan ..................... 6-221234

[51] Int. Cl.$^6$ .................. H01L 27/10
[52] U.S. Cl. .................. 257/202
[58] Field of Search .................. 257/401, 202, 257/204, 205, 206, 208, 211, 390, 207

[56] References Cited

U.S. PATENT DOCUMENTS 5,440,154  8/1995  Carmichael et al. ............. 257/202 X

FOREIGN PATENT DOCUMENTS

| 0357410 | 3/1990 | European Pat. Off. | 257/206 |
| 5831577 | 2/1983 | Japan | 257/401 |
| 1-112749 | 5/1989 | Japan . | |
| 4165678 | 6/1992 | Japan | 257/202 |
| 5013759 | 1/1993 | Japan | 257/401 |

Primary Examiner—William Mintel
Attorney, Agent, or Firm—Oblon, Spivak, McClelland, Maier & Neustadt, P.C.

[57] ABSTRACT

A MOS gate type semiconductor device, comprising an upper source wiring consisting of a plurality of upper source electrodes, an upper drain wiring provided on a semiconductor substrate and consisting of a plurality of upper drain electrodes formed in a comb-like arrangement such that the plurality of upper drain electrodes are engaged with the upper source electrodes, lower source electrodes provided at each of lower portions of adjacent pairs of the upper source electrodes and the upper drain electrodes such that the lower source electrodes are layered below the upper source electrodes and the upper drain electrodes, and lower drain electrodes provided at each of lower portions of adjacent pairs of the upper source electrodes and the upper drain electrodes electrode such that the lower drain electrodes are layered below the upper source electrodes and the upper drain electrodes, wherein the lower source electrodes are connected to the upper source electrodes and the source region, and are disposed so as to form a wave-like shape, and the lower drain electrodes are connected to the upper drain electrodes and the drain region, and are disposed so as to form a wave-like shape.

13 Claims, 12 Drawing Sheets

MOS GATE TYPE SEMICONDUCTOR DEVICE

BACKGROUND OF THE INVENTION

1. Field of the Invention

The present invention relates to a MOS gate type semiconductor device having a MOS gate structure.

2. Description of the Related Art

In recent years, integrated circuits (ICs) in which a number of transistors and resistors are integrated to form electric circuits on one single chip are often used in significant parts of many computers, communication devices, and the likes. Among these ICs, such an IC which includes a high withstand voltage element is called a power IC.

A power IC integrates a drive circuit and a control circuit in itself, and application of a power IC has been proposed for various use, e.g., for use in a display drive device, a car mount IC, and the likes. Therefore, it is demanded that a high withstand voltage MOSFET (e.g., a lateral type MOSFET) used in an output stage of a power IC should have a high drain withstand voltage and a low ON-resistance.

FIG. 12 is a cross-section showing an element structure of a conventional lateral type MOSFET. In this figure, a reference 91 denotes a p-type semiconductor substrate, and an n-type source area 92 of high density (or low resistance) is selectively formed on the surface of the p-type semiconductor substrate 91.

In addition, an n-type drift region 93 of a low density (or high resistance) for ensuring a certain withstand voltage is selectively formed on the surface of the p-type semiconductor substrate 91, and an n-type drain region 94 of a high density is selectively formed on the surface of this n-type drift region 93.

A gate electrode 96 is provided on the p-type semiconductor substrate 91 between the n-type source region 92 and the n-type drift region 93, with a gate insulating film 95 inserted between the electrode 96 and the substrate 91o In addition, the n-type source region 92 is provided with a source electrode 97, and the source electrode 97 is in contact with both of the n-type source region 92 and the p-type semiconductor substrate 91. A drain electrode 98 is provided on the n-type drain region 94.

Meanwhile, the source-drain wiring pattern (SD wiring pattern) as a first layer in direct contact with source and drain regions is roughly classified into two kinds of patterns, i.e., a stripe wiring pattern and a mesh wiring pattern.

FIG. 13 is a plan view showing a stripe wiring pattern and FIG. 14 is a plan view showing a mesh wiring pattern.

The stripe wiring pattern is a pattern in which a linear source electrode 97, a linear gate electrode 96, and a linear drain electrode 98 are disposed alternately one after another, as shown in FIG. 13. In case of this stripe wiring pattern, the distance between a source electrode 97 and a drain electrode 98 is uniform.

On the other hand, the mesh pattern is a pattern in which source electrodes 96 and drain electrodes 98 are disposed in a matrix grid, which is surrounded by a gate electrode 96. In case of this mesh wiring pattern, the distance between a gate electrode 96 and a drain electrode 98 is not uniform. At several portions, this distance is longer than the distance in a stripe wiring pattern. However, since the drain electrode 98 is surrounded by the gate electrode, a gate electrode has of the mesh wiring pattern has a width greater than the stripe wiring pattern.

Thus, a stripe wiring pattern and a mesh wiring pattern are used as the SD wiring pattern as a first layer. However, when the size of each electrode is greater in comparison with the distance between the source and drain, the mesh pattern is rather effective. On the contrary, when the size of each electrode is small, the stripe wiring pattern is rather effective.

As has been described above, an n-type drift region 93 exists in a lateral type MOSFET element. The withstand voltage of the element is determined, depending on the impurity density of the n-type drift region 93 and the distance between a drain and a gate. To increase the withstand voltage, a drain region of a certain length is required. Therefore, in case of a lateral type MOSFET element, as the down-sizing of the element is proceeded, the stripe wiring pattern becomes more effective than the mesh wiring pattern.

Meanwhile, in case where the SD wiring pattern of as the first layer from the substrate is formed in a stripe wiring pattern, the SD wiring pattern of the second layer may be those wiring patterns which are shown in FIGS. 15 and 16. In these figures, the region indicated by oblique lines denotes a contact region between the SD wiring of the first layer and the SD wiring of the second layer, and the arrow denotes a current path.

The SD wiring pattern of the second layer in FIG. 15 is a pattern (a diagonal pattern) in which the lengthwise direction of source electrodes $S_2$ and drain electrodes $D_2$ is diagonal to the lengthwise direction of source electrodes $S_1$ and drain electrodes $D_1$.

Here, to decrease the resistance of the SD wiring of the second layer, the wiring width $W_2$ may be increased. As the greater the wiring width $W_2$ is, the larger the contact area between the SD wiring of the first layer and the SD wiring of the second layer is, and therefore, the smaller the contact resistance at the contact area is.

However, if the wiring width $W_2$ is large, an effective distance between two adjacent contact regions is long. In other words, the current path between the contact region of the source wiring and the contact region of the drain wiring is long, and therefore, the contact resistance (i.e., the contact resistance of a first type) between contact regions equivalent a unit wiring width is increased.

For example, this state will be explained with reference to FIG. 17. FIG. 17 is a graph showing dependency of a wiring resistance on the wiring width $W_2$ in a MOSFET using a diagonal wiring pattern. As shown in this figure, a broken line 110 indicating the wiring resistance of the second layer, the wiring resistance decreases in inverse proportion to the $W_2$, while the wiring resistance increases in proportion to the $W_2$ in case of a broken line 111 indicating the contact resistance of a first type. An actual wiring resistance is indicated by a continuous line 112 obtained by adding the broken lines 110 and 111 with each other. In case of this continuous line 112, the wiring width of the second layer increases in proportion to the $W_2$, within a region where the $W_2$ is small, and therefore, the wiring resistance decreases in inverse proportion to the $W_2$. In case where the $W_2$ is large, the effect that the length of a current path increases is prior to the effect that the contact area increases in proportion to the $W_2$, and therefore, the wiring resistance increases in proportion to the $W_2$.

Consequently, in case of a diagonal wiring pattern, there is a problem that the current path between the contact region of a source wiring and the contact region of a drain wiring is enlarged, and therefore, the contact resistance of the first type becomes high, if the wiring width $W_2$ is large while the resistance of the SD wiring of the second layer is small.

On the other hand, the SD wiring pattern of the second layer in FIG. 16 is a pattern (i.e., a parallel wiring pattern) in which the lengthwise direction of its source electrodes $S_2$ and drain electrodes $D_2$ is parallel to the lengthwise direction of the lengthwise direction of the source electrodes $S_1$ and drain electrodes $D_1$ of the first layer.

In this case, since the contact area are between the SD wiring of the first layer and the SD wiring of the second layer is larger than in the case of FIG. 15, the contact resistance (i.e., the contact resistance of a second type) between the SD wiring of the first layer and the SD wiring of the second layer becomes much smaller.

However, the resistance of the SD wiring of the second layer is limited by the SD wiring of the first layer. Specifically, the wiring width $W_2$ of the drain electrodes $D_2$ (or source electrodes $S_2$) of the second layer cannot be arranged to be larger than the twice of the distance between a drain electrode $D_1$ and a source electrode $S_1$ of the first layer, and therefore, the resistance of the SD wiring of the second SD wiring cannot be greatly decreased, unlike in the case of the diagonal wiring pattern shown in FIG. 15.

For example, this state will be explained with reference to FIG. 18. FIG. 18 is a graph showing a $L_2$ dependency in a MOSFET using a parallel wiring pattern. The $L_2$ denotes a overlapping width for which comb-like teeth of source and drain electrodes of the second layer are overlapped on each other. In addition, L denotes the pitch of a repeated pattern of the SD wiring of the second layer, and is here set to L=50 μm. As shown in the figure, according to the broken line 120 indicating a case where the $L_2$ is small, the wiring resistance decreases in proportion to the $L_2$, while the wiring resistance increases in inverse proportion to the (L–$L_2$) according to the broken line 121 indicating a case where the $L_2$ is large. An actual wiring resistance is indicated by a continuous line 122 obtained by adding the broken lines 120 and 121 with each other. In case of this continuous line 122, within a region where the $L_2$ is small, the current path between a drain electrode and a source electrode of the first layer is long, and therefore the resistance is relatively high. Within this region, since the current path becomes short in proportion to the $L_2$, the wiring resistance decreases in proportion to the $L_2$. In case where the $L_2$ is large, since the value of (L–$L_2$) in the drain electrodes and source electrodes of the second layer decreases in proportion to the $L_2$, the wiring resistance increases together with the $L_2$.

Consequently, in case of a parallel wiring pattern, there is a problem that the resistance of the SD wiring of the second layer cannot be decreased to be small although the contact resistance between the SD wiring of the first layer and the SD wiring of the second layer.

Thus, in a conventional high withstand voltage MOSFET, there is a problem that the contact resistance of the first and second types cannot be decreased to be small together with the resistance of the second layer.

On the other hand, as a wiring pattern other than a diagonal wiring pattern and a parallel wiring pattern, an oblique wiring pattern is disclosed in the Japanese Patent Application KOKAI Publication No. 1-112749, as long as a logic element having wirings of three or more layers is concerned. FIG. 19 schematically shows this oblique wiring pattern. This oblique wiring pattern consists of first layer wirings 131 formed in the longitudinal direction, second layer wirings 132 formed in the lateral direction, and third layer wirings 133 formed in an oblique direction such that the wirings 133 connects the cross points of the first and second layer wirings 131 and 132. The wiring layers are connected with each other through via-holes provided in the cross points.

SUMMARY OF THE INVENTION

The present invention has an object of providing a MOS gate type semiconductor device in which resistances of first and second types can be decreased to be small together with the resistance of an SD wiring of a second layer.

In order to achieve the above object, a MOS gate type semiconductor device according to the present invention comprises: a semiconductor substrate on a surface of which a source region and a drain region are formed; an upper source wiring provided on the semiconductor substrate consisting of a plurality of upper source electrodes formed in a comb-like arrangement; an upper drain wiring provided on the semiconductor substrate consisting of a plurality of upper drain electrodes formed in a comb-like arrangement such that the plurality of upper drain electrodes are engaged with the upper source electrodes; lower source electrodes provided at each of lower portions of adjacent pairs of the upper source electrodes and the upper drain electrodes such that the lower source electrodes are layered below the upper source electrodes and the upper drain electrodes; and lower drain electrodes provided at each of lower portions of adjacent pairs of the upper source electrodes and the upper drain electrodes such that the lower drain electrodes are layered below the upper source electrodes and the upper drain electrodes, characterized in that the lower source electrodes are connected to the upper source electrodes and the source region, and are disposed so as to form a wave-like shape extending in a direction in which the upper source electrodes are disposed, and that the lower drain electrodes are connected to the upper drain electrodes and the drain region, and are disposed so as to form a wave-like shape extending in a direction in which the upper drain electrodes are disposed, in parallel with the lower source electrodes.

According to this invention, since the wiring width of an upper source electrodes and an upper drain electrodes can be arranged to be larger than the distance between a lower source electrode and a lower drain electrode, the resistances of the upper source wiring and the upper drain wiring can be reduced to be small.

Here, since lower source electrodes and lower drain electrodes are formed to be disposed in a wave-like shape, the lengthwise direction of the lower source electrodes and the lower drain electrodes is not diagonal to the lengthwise direction of upper source electrodes and upper drain electrodes.

As a result of this, the effective length of the current path extending from an upper source electrode through a lower source electrode and a lower drain electrode to an upper drain electrode is shorter than that of a diagonal wiring pattern shown in FIG. 15.

Therefore, if the wiring width is arranged to be large, the contact resistance (i.e., the contact resistance of a first type) between contact regions in one unit wiring width is not increased. In this case, the contact regions are a region where a lower source electrode has a contact with a source region, and a region where a lower drain electrode has a contact with a drain region.

In addition, since the area of the contact regions is increased to be large, the contact resistance (i.e., the contact resistance of a second type) between a lower source electrode and an upper source electrode as well as the contact resistance (i.e., the contact resistance of a second type) between a lower drain electrode and an upper drain electrode is reduced to be small.

Further, another MOS gate type semiconductor device according to the present invention comprises: a semiconductor substrate on a surface of which a source region and a drain region are formed; an upper source wiring provided on the semiconductor substrate consisting of a plurality of upper source electrodes formed in a comb-like arrangement; an upper drain wiring provided on the semiconductor substrate consisting of a plurality of upper drain electrodes formed in a comb-like arrangement such that the plurality of upper drain electrodes are engaged with the upper source electrodes; lower source electrodes provided at each of lower portions of adjacent pairs of the upper source electrodes and the upper drain electrodes such that the lower source electrodes are layered below the upper source electrodes and the upper drain electrodes; and lower drain electrodes provided at each of lower portions of adjacent pairs of the upper source electrodes and the upper drain electrodes such that the lower drain electrodes are layered below the upper source electrodes and the upper drain electrodes, characterized in that the lower source electrodes are connected to the upper source electrodes and the source region, and are disposed so as to form a wave-like shape extending in a lengthwise direction of the upper source electrodes, and that the lower drain electrodes are connected to the upper drain electrodes and the drain region, and are disposed so as to form a wave-like shape extending in a lengthwise direction of the upper drain electrodes, in parallel with the lower source electrodes.

Here, those of the lower source electrodes disposed to form the wave-like shape, which are connected to a same source region and are adjacent to each other, may be formed to be integral with each other, and those of the lower drain electrodes disposed to form the wave-like shape, which are connected to a same drain region and are adjacent to each other, may be formed to be integral with each other.

In addition, the lower source electrodes may be disposed such that the lower source electrodes have a lengthwise direction oblique at an angle of 30° to 60° to a lengthwise direction of the upper source electrodes.

Likewise, the lower drain electrodes may be disposed such that the lower drain electrodes have a lengthwise direction oblique at an angle of 30° to 60° to a lengthwise direction of the upper drain electrodes.

Further, a contact area of a portion where one of the lower source electrodes is layered below one of the upper source electrodes may be equal to a contact area of a portion where another one of the lower source electrodes is layered below another one of the upper source electrodes, and a contact area of a portion where one of the lower source electrodes is layered below one of the upper drain electrodes may be equal to a contact area of a portion where one of the source electrodes is layered below one of the drain electrodes.

In addition, a contact area of a portion where one of the lower drain electrodes is layered below one of the upper drain electrodes may be equal to a contact area of a portion where another one of the lower source electrodes is layered below another one of the upper source electrodes, and a contact area of a portion where one of the lower drain electrodes is layered below one of the upper source electrodes may be equal to a contact area of a portion where another one of the lower drain electrodes is layered below another one of the upper source electrodes.

Further, a MOS gate type semiconductor device according to the present invention comprises: a semiconductor substrate on a surface of which a source region and a drain region are formed; an upper source wiring provided on the semiconductor substrate consisting of a plurality of upper source electrodes formed in a comb-like arrangement; an upper drain wiring provided on the semiconductor substrate consisting of a plurality of upper drain electrodes formed in a comb-like arrangement such that the plurality of upper drain electrodes are engaged with the upper source electrodes; lower source electrodes provided at each of lower portions of adjacent pairs of the upper source electrodes and the upper drain electrodes such that the lower source electrodes are layered below the upper source electrodes and the upper drain electrodes; and lower drain electrodes provided at each of lower portions of adjacent pairs of the upper source electrodes and the upper drain electrodes such that the lower drain electrodes are layered below the upper source electrodes and the upper drain electrodes, characterized in that the lower source electrodes are connected to the upper source electrodes and the source region, and have a lengthwise direction oblique to a lengthwise direction of the upper source electrodes, and that the lower drain electrodes are connected to the upper drain electrodes and the drain region, and are formed to be disposed alternately in parallel with the lower source electrodes.

In this structure, the contact resistance of first and second types and the resistance of the SD wiring of the second layer can be reduced to be small, like in the other structures described above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

In the following, embodiments of the present invention will be explained with reference to the drawings.

Figure 1:
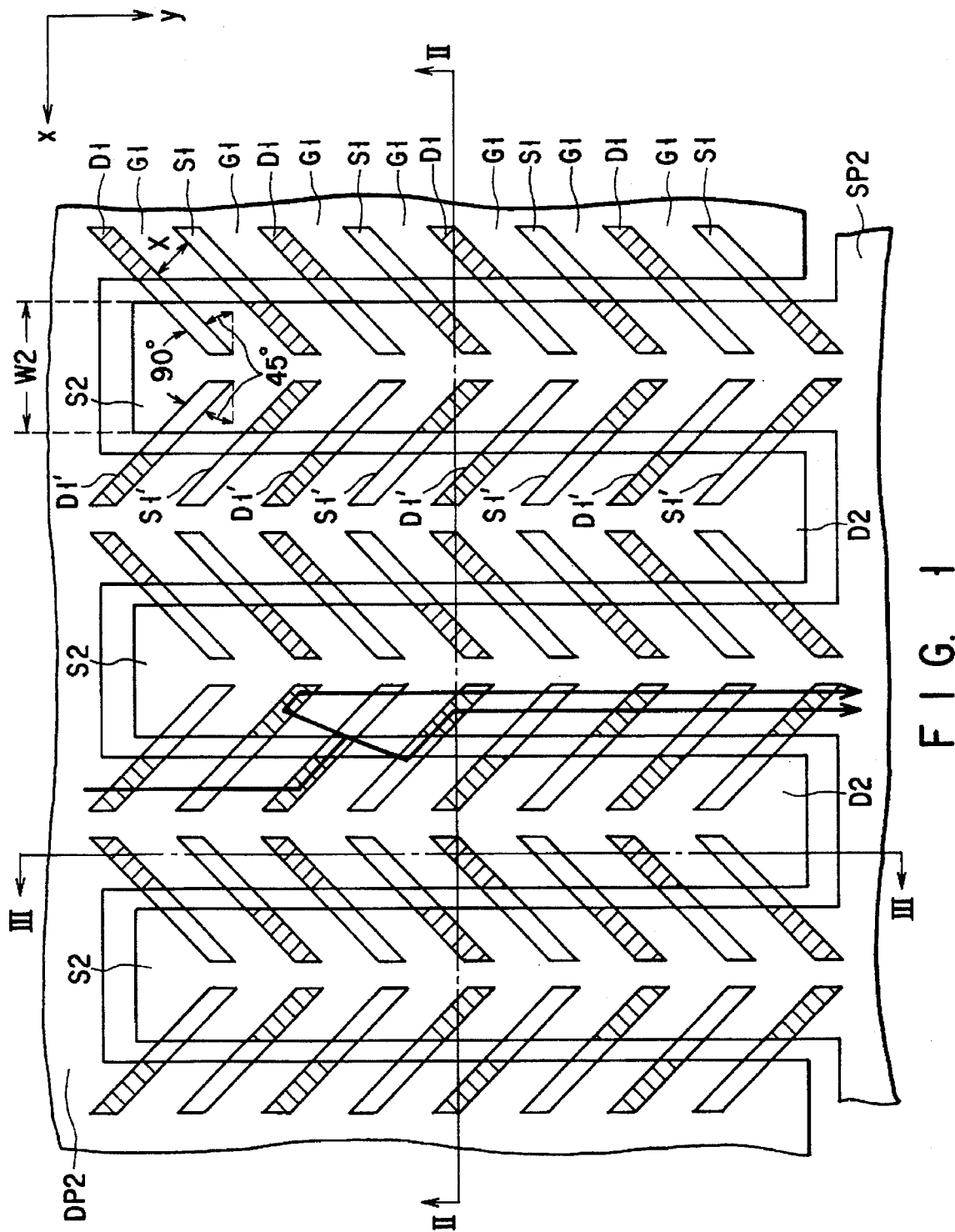
FIG. 1 is a plan view showing a two-layer structure SD wiring pattern of a high withstand voltage MOSFET according to the first embodiment of the present invention.
Figure 2:
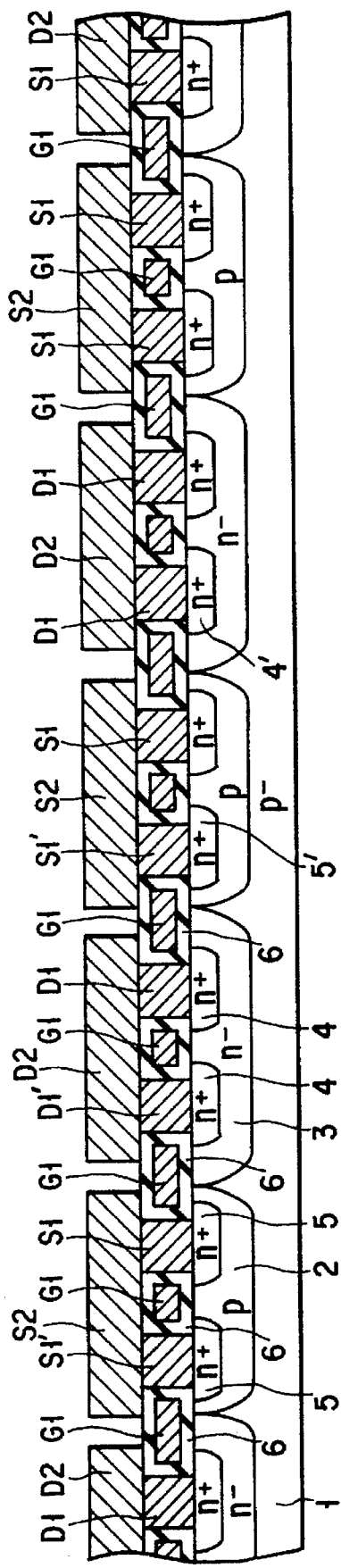
FIG. 2 is a II—II cross-section of the high withstand voltage MOSFET shown in FIG. 1.
Figure 3:
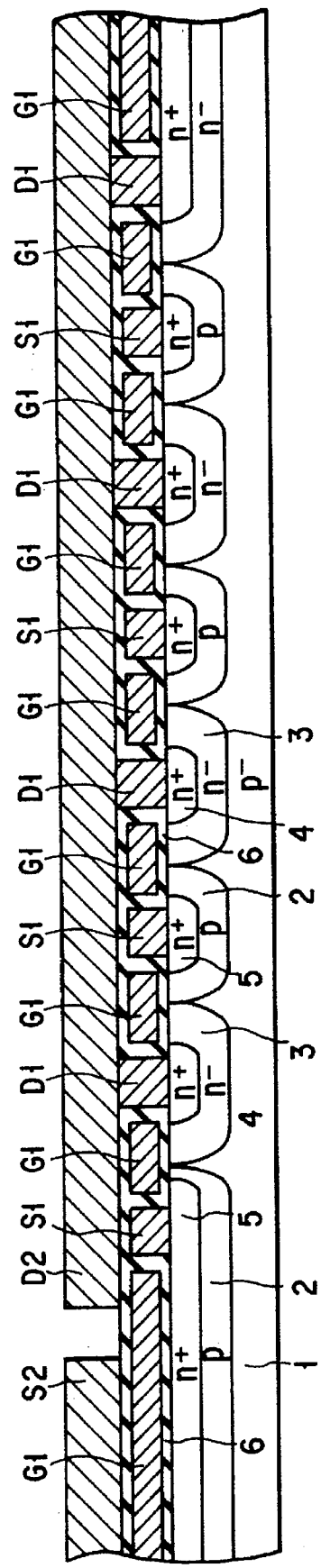
FIG. 3 is a III—III cross-section of the high withstand voltage MOSFET shown in FIG. 1.
Figure 4:
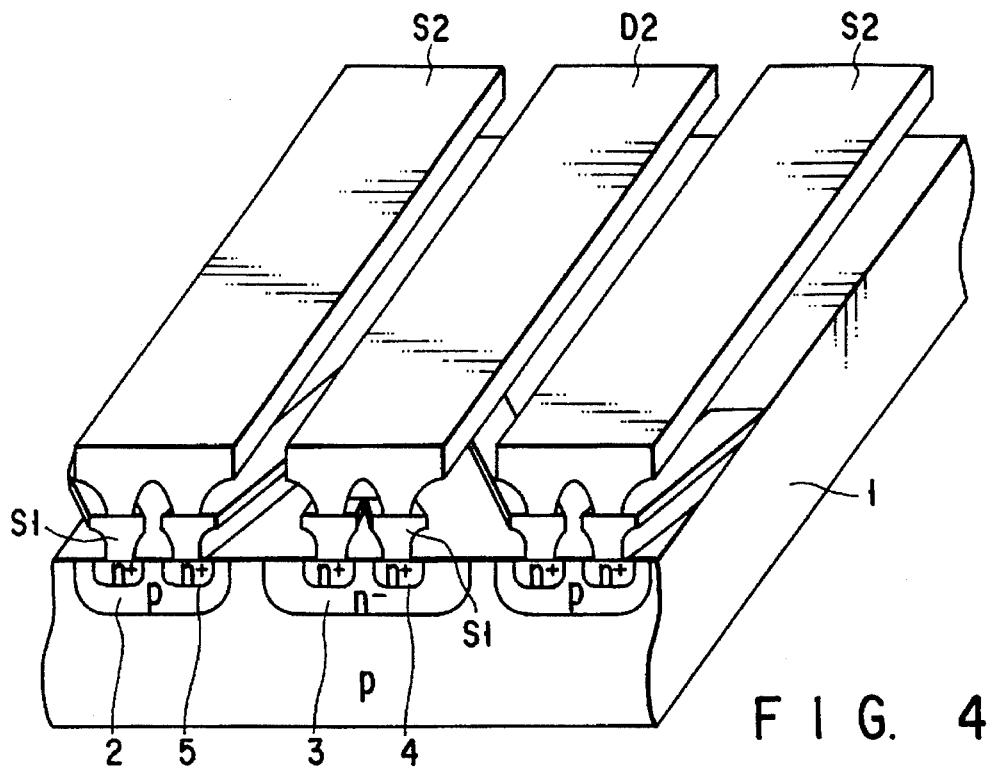
FIG. 4 is a cross-sectional perspective view of the high withstand voltage MOSFET shown in FIG. 1.

FIG. 1 is a plan view showing a two-layer structure SD wiring pattern of a high withstand voltage MOSFET according to a first embodiment of the present invention. In FIG. 1, the region indicated by oblique lines denotes a contact region between the SD wiring of the first layer and the SD wiring of the second layer, and the arrow indicates an example of a current path. FIGS. 2, 3, and 4 are respectively a FIG. 2 is a II—II cross-section, a III—III cross-section, and a cross-sectional perspective view of the high withstand voltage MOSFET shown in FIG. 1.

A p-type base region 2 and an n-type drift region 3 are selectively formed on the surface of a p- or n-type semiconductor substrate 1 of a low impurity density (or high resistance).

Two n-type source regions 5 and 5' of a high impurity density (or low resistance) are selectively formed on the surface of the p-type base region 2, and two n-type drain regions 4 and 4' are selectively formed on the surface of the n-type drift region 3.

A gate electrode $G_1$ is provided on the p-type base region 2 and n-type drift region 3 between the n-type source region 5 (5') and n-type drain region 4 (4'), with a gate insulating film 6 interposed between the electrode $G_1$ and the regions 2 and 3.

Likewise, a gate electrode $G_1$ is also provided on the p-type base region 2 between the two n-type source regions 5 and 5' as well as on the n-type drift region 3 of the two n-type drain regions 4 and 4', with a gate insulating film 6 interposed between the electrode $G_1$ and the regions 2 and 3.

Source electrodes, $S_1$ and $S_1'$ (or lower layer source electrodes) as a first layer are provided on the n-type source regions 5 and 5', and a source electrode $S_2$ (or upper layer source electrode) as a second layer is provided on these source electrodes $S_1$ and $S_1'$. Likewise, drain electrodes $D_1$ and $D_1'$ (or lower drain electrodes) as a first layer are respectively provided on the n-type drain regions 4 and 4'.

The SD wiring pattern of the second layer consisting of a source electrode $S_1$ and a drain electrode $D_1$, and the SD wiring pattern of the first layer consisting of a source electrode $S_2$ and a drain electrode $D_2$ are formed in the following manner.

Firstly, the SD wiring pattern of the first layer will be explained as follows, with reference to an x-y diagonal coordinates. Note that the x-axis is an axis parallel to the lengthwise direction of a drain wiring $DP_2$, while the y-axis is an axis parallel to the lengthwise direction of a drain electrode $D_2$.

As shown in FIG. 1, the lengthwise direction of the drain electrode $D_1$ is oblique to the x-axis at 45°. A drain electrode $D_1'$ which is symmetrical to the drain electrode $D_1$ with respect to a line in the y-axis direction is formed at a position apart from the drain electrode $D_1$ by a predetermined distance in the left-hand x-axis direction.

Here, both of the drain electrodes $D_1$ and $D_1'$ are inclined such that those portion of both electrodes which are in contact with the drain electrode $D_2$ of the second layer are much closer to the bottom end portion of the drain electrode $D_2$ of the second layer. In other words, the drain electrodes $D_1$ and $D_1'$ are formed so as to constitute a pattern having a shape like a letter of V separated at its center into two halves (which is referred to as a separated-V-shape pattern).

Source electrodes $S_1$ and $S_1'$ also forming a symmetrical separated-V-shape pattern similar to the drain electrodes $D_1$ and $D_1'$ are formed in the down side of the drain electrodes $D_1$ and $D_1'$ forming a shaped pattern, in the y-axis direction, with a gate electrode (whose shape is not specifically limited) interposed therebetween.

Further, drain electrodes $D_1$ and $D_1'$ paired to form a separated-V-shape pattern and source electrodes $S_1$ and $S_1'$ also paired to form a separated-V-shape pattern are repeatedly formed in the downward direction along the y-axis.

A wiring pattern constituted by pairs of drain electrodes and pairs of source electrodes, each pair of which forms a separated-V-shape pattern, are repeated in the x-axis direction, thereby forming the SD wiring pattern of the first layer.

That is, as a whole, in the SD wiring pattern of the first layer, drain electrodes $D_1$ and $D_1'$ are disposed in the x-axis direction, thereby forming a wave-like shape. Likewise, source electrodes $S_1$ and $S_1'$ are disposed so as to form a wave-like pattern in the x-axis direction.

On the other hand, the SD wiring pattern of the second layer consists of a source wiring $S_2$ constituted by disposing a plurality of source electrodes $S_2$ in an arrangement like comb-teeth in the x-axis direction, and of a drain wiring $D_2$ constituted by disposing a plurality of drain electrodes $D_2$ in an arrangement like comb-teeth, wherein the plurality of drain electrodes $D_2$ are engaged with the plurality of source electrodes $S_2$.

Here, the positional relationship between the SD wiring pattern of the first layer and the SD wiring pattern of the second layer will be explained as follows.

The source electrodes $S_1$ and $S_1'$ are arranged such that the lengthwise direction of these electrodes is oblique at an angle of 45° to the lengthwise direction of the source electrodes $S_2$.

Likewise, the drain electrodes $D_1$ and $D_1'$ are arranged such that the lengthwise direction of these drain electrodes is oblique at an angle of 45° to the lengthwise direction of the drain electrodes $D_2$.

Further, the area of the portion where source electrode $S_1$ and $S_2$ overlap each other is equal to the area where a source electrode $S_1'$ and a source electrode $S_2$ overlap each other. In addition, the area where a source electrode $S_1$ and a drain electrode $D_2$ overlap each other is equal to the area where a source electrode $S_1$ and a drain electrode $D_2$ overlap each other.

Likewise, the area of the portion where a drain electrode $D_1$ and a source electrode $S_2$ overlap each other is equal to the area where a drain electrode $D_1'$ and a source electrode $S_2$ overlap each other. In addition, the area where drain electrodes $D_1$ and $D_2$ overlap each other is equal to the area where a drain electrode $D_1$ and a drain electrode $D_2$ overlap each other.

According to a two-layer structure SD wiring pattern consisting of the first and second layers as described above, the wiring width $W_2$ of the source electrode $S_2$ (or drain electrode $D_2$) of the second layer can be arranged to be larger than the distance between the source electrode $S_1$ and the drain electrode $D_1$, the resistance of the SD wiring of the second layer can be reduced to be small.

In addition, since a part of the portion where the source electrode $S_1$ and the source electrode $S_2$ overlap each other is arranged opposite to a part of the portion where the drain electrode $D_1$ and the drain electrode $D_2$ overlap each other, the current path can be former shortened.

Figure 15:
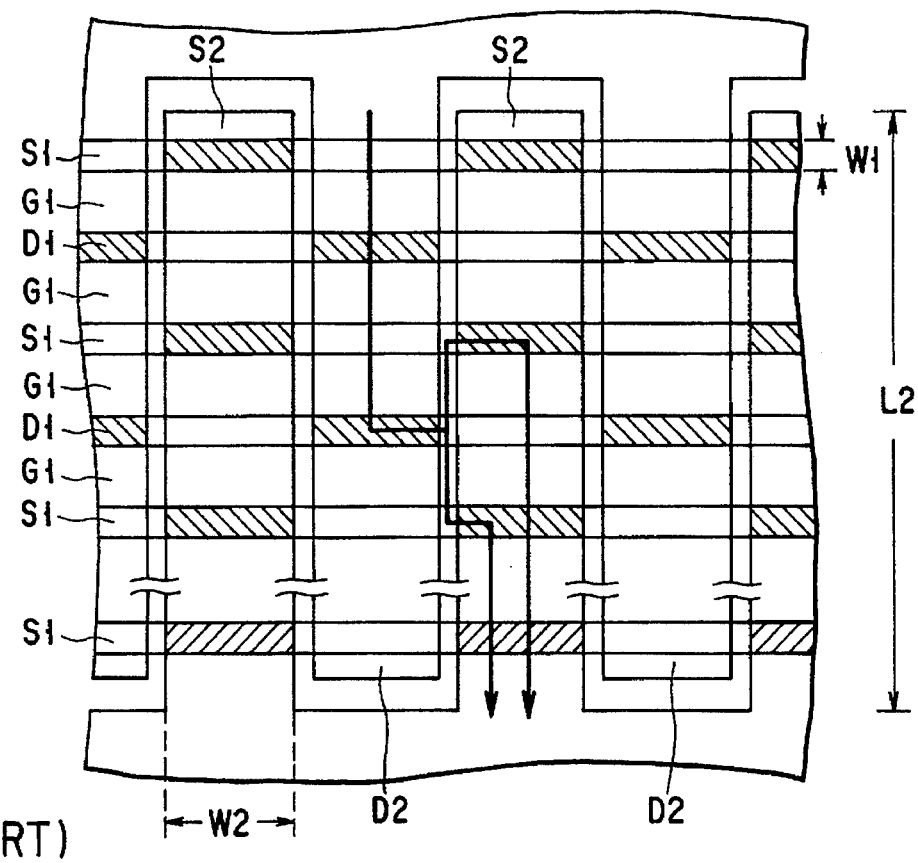
FIG. 15 is a plan view showing an SD wiring pattern of a conventional second layer.
Figure 16:
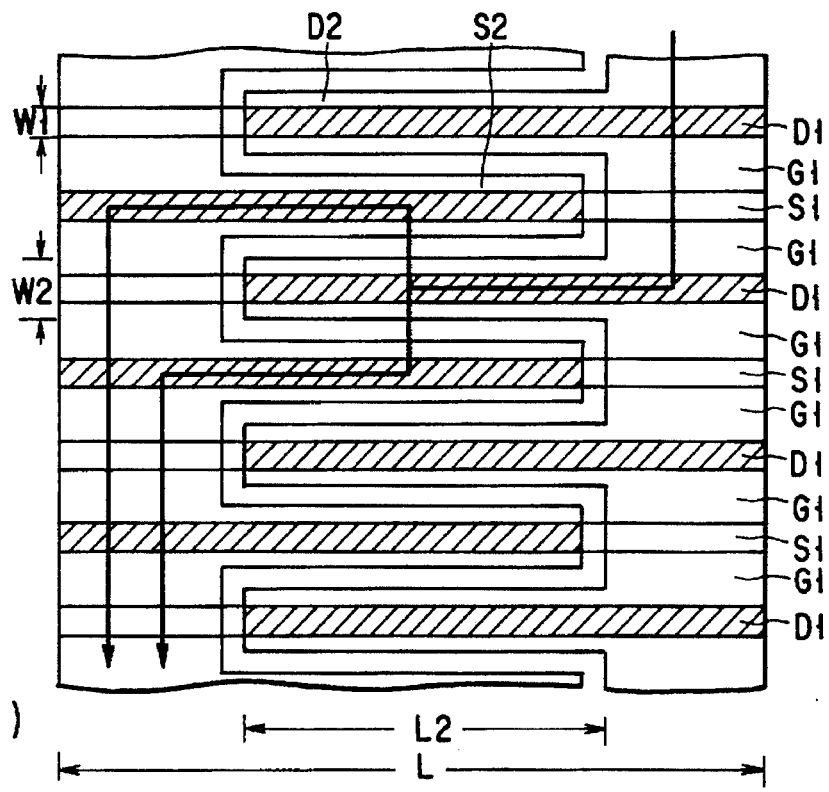
FIG. 16 is a plan view showing another SD wiring pattern of another conventional second layer.
Figure 17:
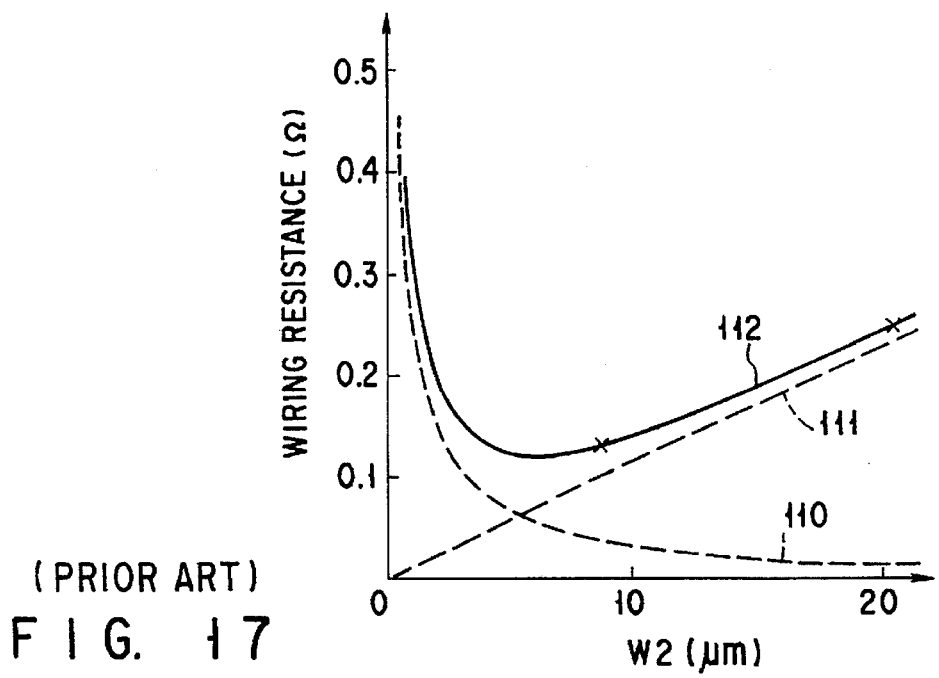
FIG. 17 is a graph showing the dependency of a wiring resistance on a wiring width $W_2$ in a MOSFET using a diagonal wiring pattern.
Figure 18:
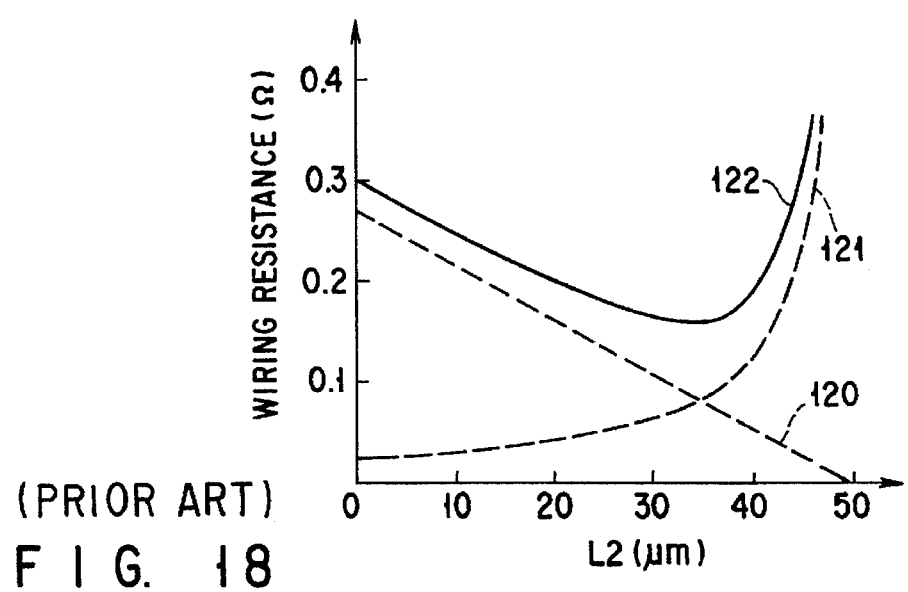
FIG. 18 is a graph showing the dependency of a wiring resistance on a wiring length $L_2$ in a MOSFET using a parallel wiring pattern.
Figure 19:
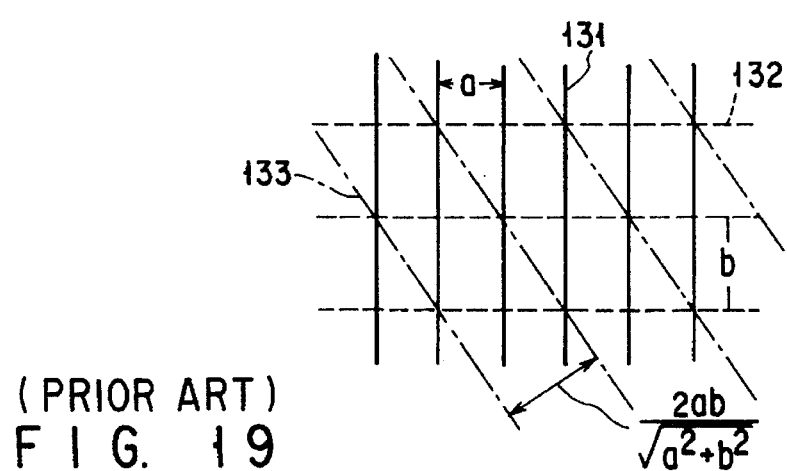
FIG. 19 schematically shows a conventional oblique wiring pattern.

Here, the effective length of the current path extending through the drain electrode $D_2$, the drain electrode $D_1$, the source electrode $S_1$, and the source electrode $S_2$ is shorter than the effective length of the current path of the wiring pattern shown in FIG. 15 by a length of $(2-2^{1/2}) \cdot (W_2-x)$ where x denotes the distance between source and drain electrodes, since the lengthwise direction of the source electrode $S_1$ and the drain electrode $D_1$ of the first layer is (not diagonal but) oblique at an angle of 45° to the lengthwise direction of the drain electrode $D_2$ of the source electrode $S_2$ and the drain electrode $D_2$.

Therefore, if the wiring width $W_2$ is set to be large, the contact resistance (i.e., the contact resistance of the second type) between the wiring of the first layer and the wiring of the second layer in one unit wiring width is not increased to be high, in comparison with the conventional diagonal arrangement pattern, and thus, causing no problems.

In addition, since the lengthwise direction of the source electrode $S_1$ and the drain electrode $D_1$ of the first layer extends in a direction oblique at an angle of 45° to the lengthwise direction of the source electrode $S_2$ and the drain electrode $D_2$ of the second layer, the contact area is increased to be $2^{1/2}$ times larger than that of the wiring pattern shown in FIG. 15, so that the contact resistance (i.e., the contact resistance of the second type) is decreased to be small.

Figure 5:
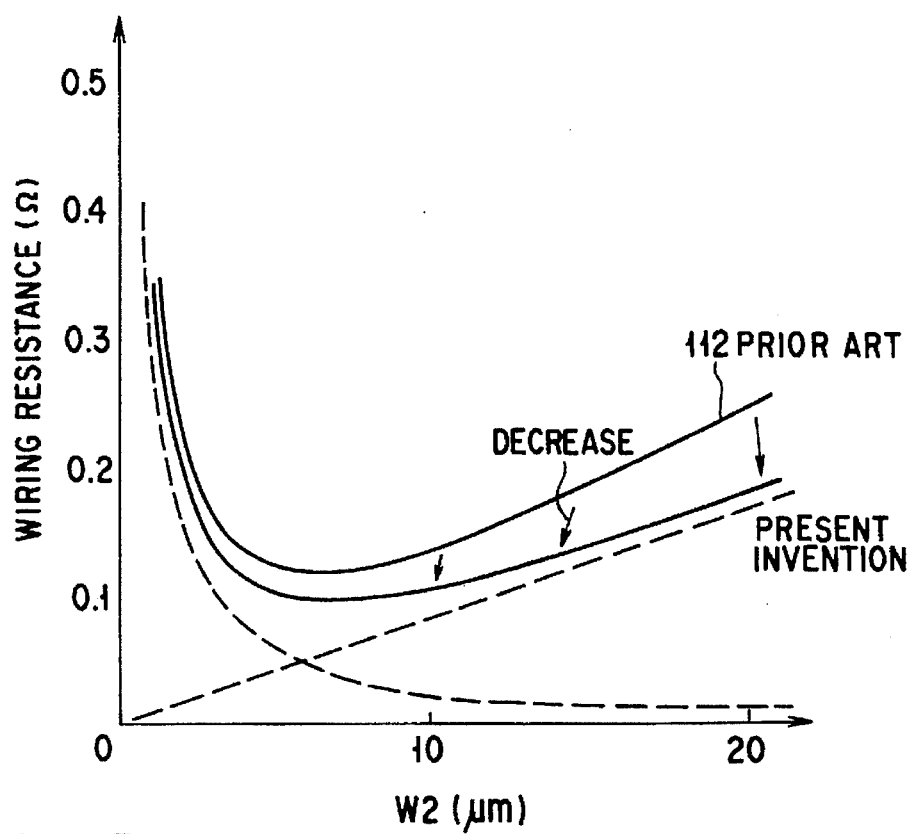
FIG. 5 is a graph showing a result of a test in which the wiring resistance of the MOS gate type semiconductor device according to this embodiment is compared with the wiring resistance of a conventional diagonal arrangement pattern.

FIG. 5 is a graph showing test results obtained by comparing the wiring resistance of a MOS gate type semiconductor device according to the present embodiment with the wiring resistance of a conventional diagonal arrangement pattern. As shown in this figure, the wiring resistance of this embodiment can be reduced, by about 20%, in comparison with the conventional diagonal arrangement pattern.

In addition, according to the present embodiment, the pattern of the gate electrodes can be arranged in a mesh pattern, so that a voltage drop of the gate voltage at a gate end portion can be prevented even when a gate electrode made of material having a relatively high resistance, such as a polysilicon gate, is used. Further, this embodiment allows a larger width of a gate electrode than a strip wiring pattern, and therefore, the channel resistance can be reduced to be small.

Figure 6:
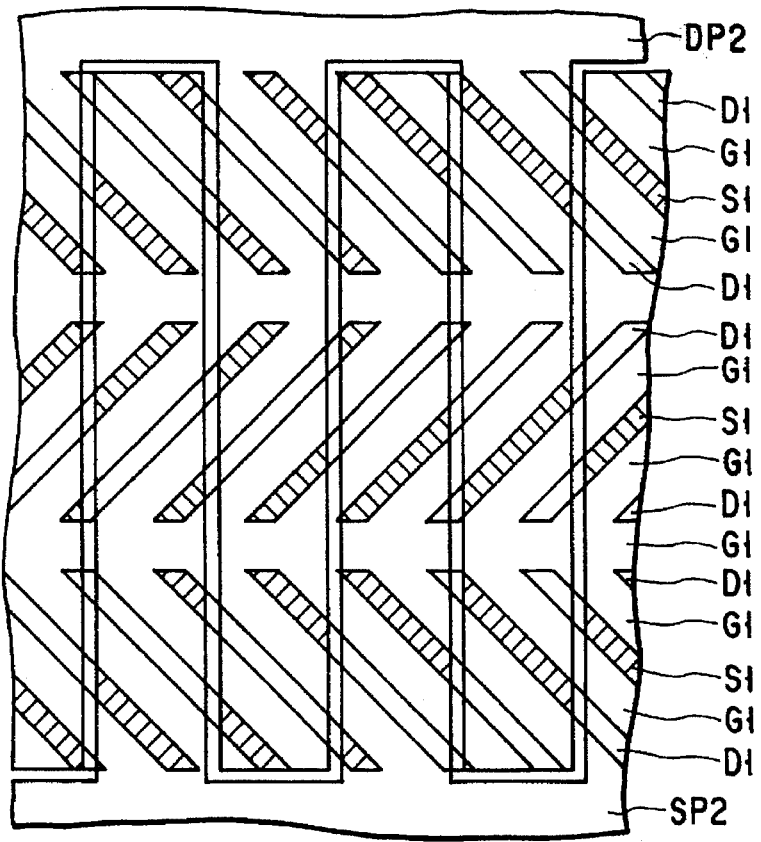
FIG. 6 is a plan view showing a two-layer structure SD wiring pattern of a high withstand voltage MOSFET according to the second embodiment of the present invention.

FIG. 6 is a plan view showing a two layer SD wiring pattern of a high withstand voltage MOSFET according to the second embodiment of the present invention. Note that those portions of this embodiment which correspond to portions of the two-layer structure SD wiring pattern shown in FIG. 1 are denoted by the same reference symbols, and detailed explanation thereof will be omitted from the following description.

The two-layer structure SD wiring pattern according to this embodiment adopts an arrangement in which the source electrodes $S_1$ and $S_1'$ (or drain electrodes $D_1$ and $D_1'$) of the first layer are rotated by 90° in comparison with the first embodiment.

Specifically, the source electrodes $S_1$ and $S_1'$ (or drain electrodes $D_1$ and $D_1'$) are disposed to form a wave-like arrangement in the lengthwise direction of the source electrode $S_2$ and the drain electrode $D_2$. This two-layer structure SD wiring pattern attains the same effects as obtained in the first embodiment.

Figure 7:
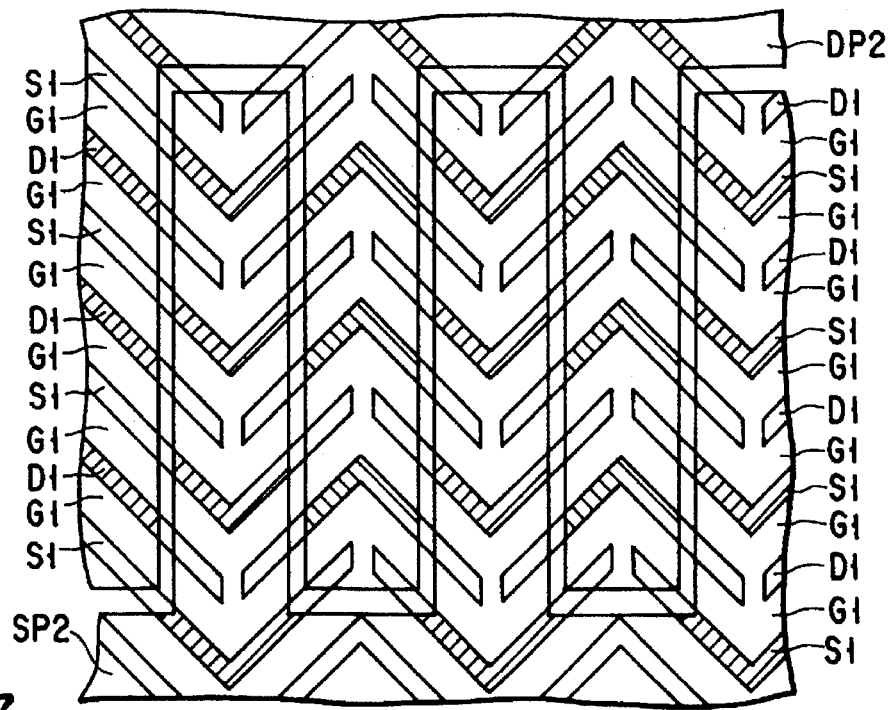
FIG. 7 is a plan view showing a two-layer structure SD wiring pattern of a high withstand voltage MOSFET according to the third embodiment of the present invention.

FIG. 7 is a plan view showing a two-layer structure SD wiring pattern of a high withstand voltage MOSFET according to the third embodiment of the present invention.

In the two-layer structure SD wiring pattern of this embodiment, the source electrodes $S_1$ and $S_1'$ (or drain electrodes $D_1$ and $D_1'$) of the first layer constitute a pattern in which a V-shape pattern and a separated-V-shape pattern are alternatively repeated in the direction in which source electrodes $S_2$ and drain electrodes $D_2$ are disposed, in comparison with the first embodiment.

Specifically, among source electrodes $S_1$ and $S_1'$ formed and disposed in a wave-like shape, adjacent lower source electrodes which are connected to one common source region are formed to be integral with each other, and among drain electrodes $D_1$ and $D_1'$ formed and disposed in a wave-like shape, adjacent lower drain electrodes which are connected to one common drain region are formed to be integral with each other.

Consequently, the contact area can be increased to be much larger according to the third embodiment, and therefore, the contact resistance can further be lowered.

Figure 8:
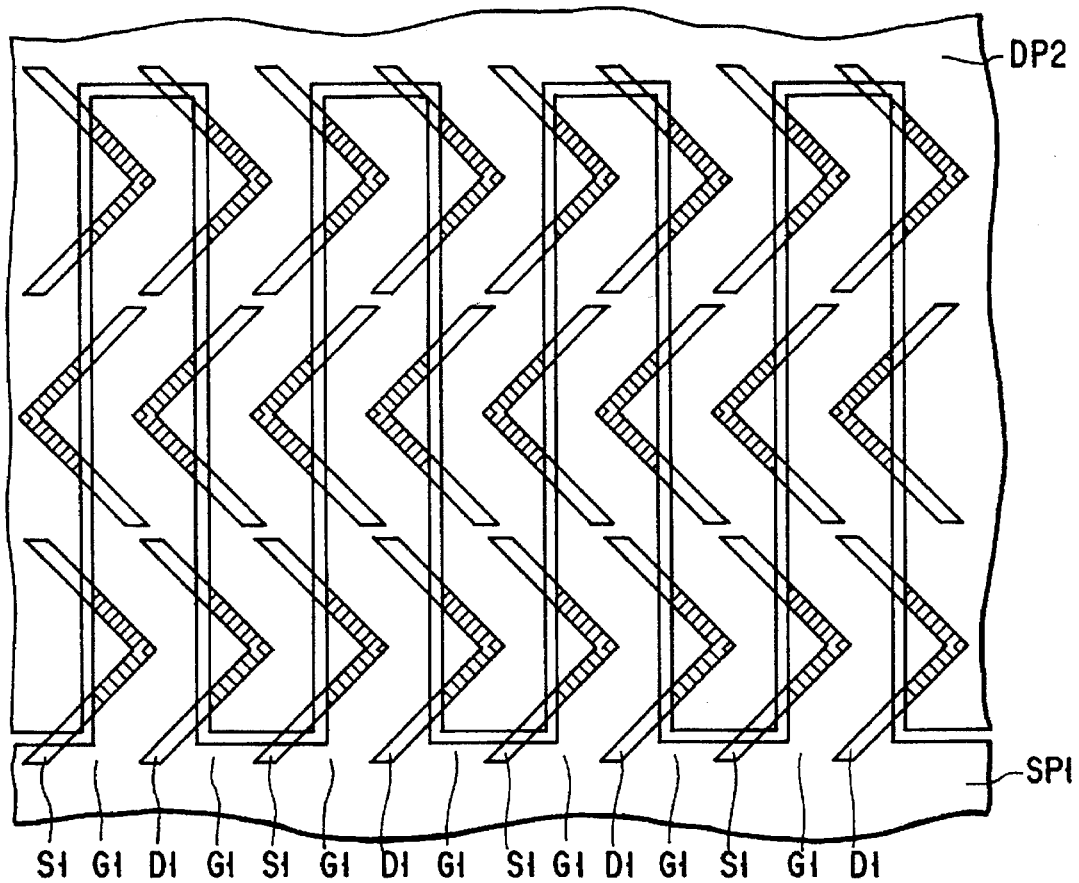
FIG. 8 is a plan view showing a two-layer structure SD wiring pattern of a high withstand voltage MOSFET according to the fourth embodiment of the present invention.

FIG. 8 is a plan view showing a two-layer structure SD wiring pattern of a high withstand voltage MOSFET according to the fourth embodiment of the present invention.

In the two-layer structure SD wiring pattern of this embodiment, the source electrodes $S_1$ and $S_1'$ (or drain electrodes $D_1$ and $D_1'$) constitute a pattern in which a V-shape pattern and a separated-V-shape pattern are alternately repeated in the lengthwise direction of the source electrode $S_2$ and the drain electrode $D_2$, in comparison with the second embodiment.

Specifically, among source electrodes $S_1$ and $S_1'$ formed and disposed in a wave-like shape, adjacent lower source electrodes which are connected to one common source region are formed to be integral with each other, and among drain electrodes $D_1$ and $D_1'$ formed and disposed in a wave-like shape, adjacent lower drain electrodes which are connected to one common drain region are formed to be integral with each other.

Consequently, the contact area can be increased to be much larger according to the fourth embodiment, and therefore, the contact resistance can further be lowered.

Figure 9:
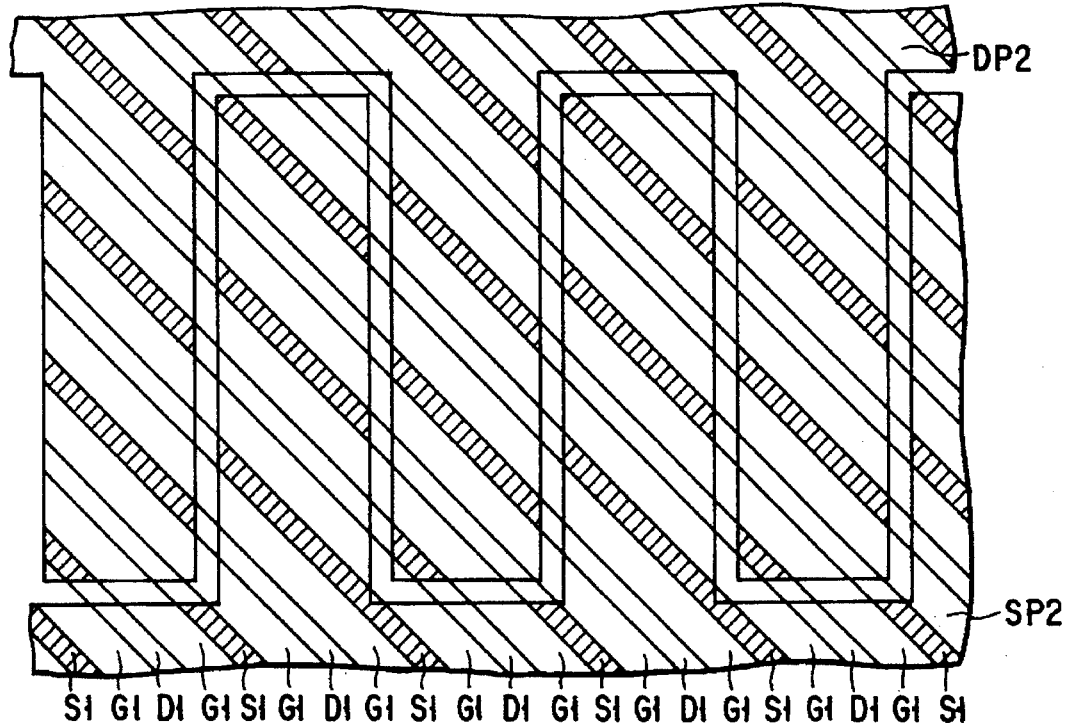
FIG. 9 is a plan view showing a two-layer structure SD wiring pattern of a high withstand voltage MOSFET according to the fifth embodiment of the present invention.

FIG. 9 is a plan view showing a two-layer structure SD wiring pattern of a high withstand voltage MOSFET according to the fifth embodiment of the present invention.

The two-layer structure SD wiring pattern of this embodiment is different from the first embodiment in that the source electrodes $S_1$ and $S_1'$ (or drain electrodes $D_1$ and $D_1'$) of the first layer constitute a pattern in which a plurality of lines are disposed in parallel with each other. According to this two-layer structure SD wiring pattern, the same effects as obtained in the first embodiment can be attained.

Figure 20:
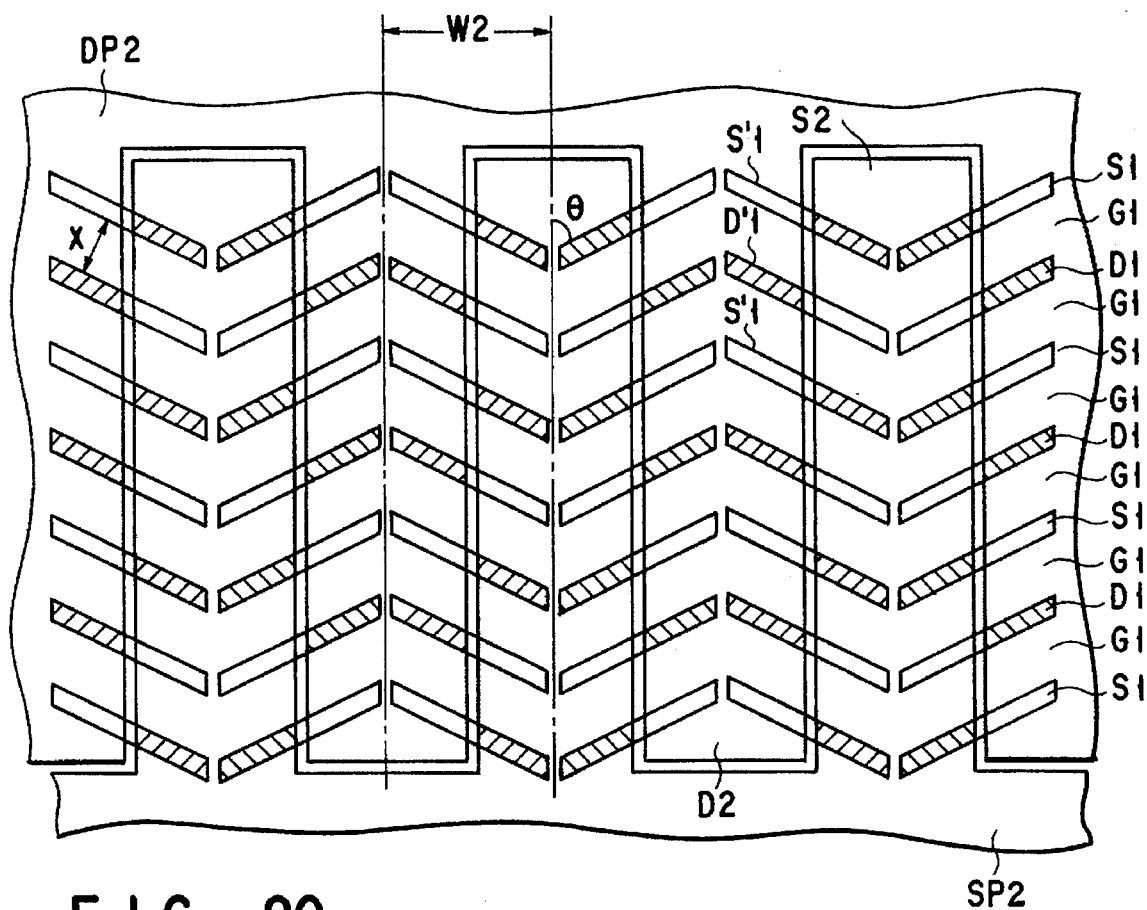
FIG. 20 is a plan view showing the two-layer structure SD wiring pattern of a high withstand voltage MOSFET according to the sixth embodiment of the present invention.

FIG. 20 is a plan view showing two-layer structure SD wiring pattern of a high withstand voltage MOSFET according to the sixth embodiment of the present invention.

The two-layer structure SD wiring pattern of this embodiment is a modification of the first embodiment, in which source electrodes $S_1$ and $S_1'$ and drain electrodes $D_1$ and $D_1'$ of a first layer are arranged to be inclined at an arbitrary angle θ ranging from 30° to 60° with respect to source electrodes $S_2$ and drain electrodes $D_2$ of a second layer. The following explains that the same advantages as obtained in the first embodiment can be obtained with use of this two-layer structure SD wiring pattern.

It is here supposed that the lengthwise direction of the source electrodes $S_1$ and $S_1'$ of the first layer extend at an angle θ to the lengthwise direction of the second source electrodes $S_2$. Likewise, it is supposed that the lengthwise direction of the lower drain electrodes $D_1$ and $D_1'$ extend at an angle θ to the lengthwise direction of the second layer.

The effective length of the current path is reduced in accordance with the angle θ, where the length of the current path in an orthogonal wiring pattern having an angle θ of 90° is used as a standard reference.

The reduction in length of the current path is expressed in the formula (1) below:

$$\Delta L = (w2 - x) \times \frac{\sin\theta + \cos\theta - 1}{\sin\theta} \quad (1)$$

For example, if θ=45° is substituted into the formula (1), $\Delta L = (W2-x) \cdot (2-2^{1/2})$ is obtained.

Figure 21:
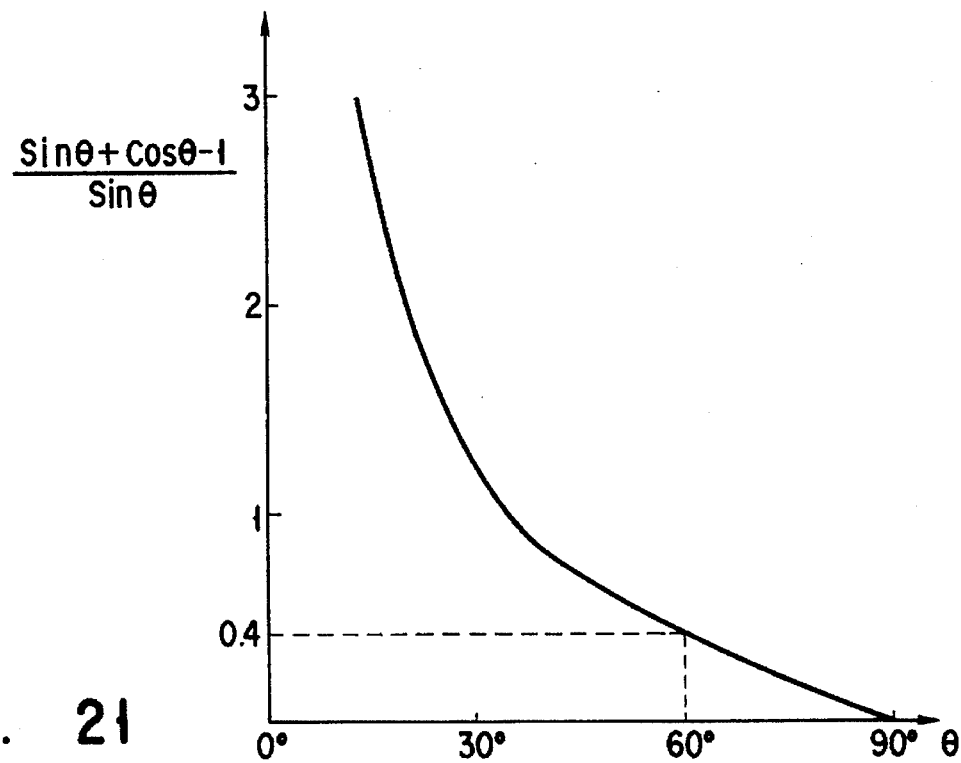
FIG. 21 is a graph which explains the relation between the formula (1) and the angle θ in the sixth embodiment.

Here, ΔL is proportional to the term of $(\sin\theta+\cos\theta-1)/\sin\theta$. On the other hand, the term of $(\sin\theta+\cos\theta-1)/\sin\theta$ decreases in proportion to the angle θ, as shown in FIG. 21. Therefore, a smaller angle θ is more preferable for ΔL, from the view point of increasing the value of ΔL. A preferable value of the angle θ is selected from a range of θ≦60°, so as to satisfy a relation of $(\sin\theta+\cos\theta-1)/\sin\theta \geq 0.4$, on the basis of FIG. 21.

In the next, the length of a contact region of the source wiring and the length of a contact region of the drain wiring are increased in accordance with the angle θ as shown in the following formula (2):

$$\text{Increase in length of the contact region} = W2 \times \frac{1-\sin\theta}{\sin\theta} \quad (2)$$

Figure 22:
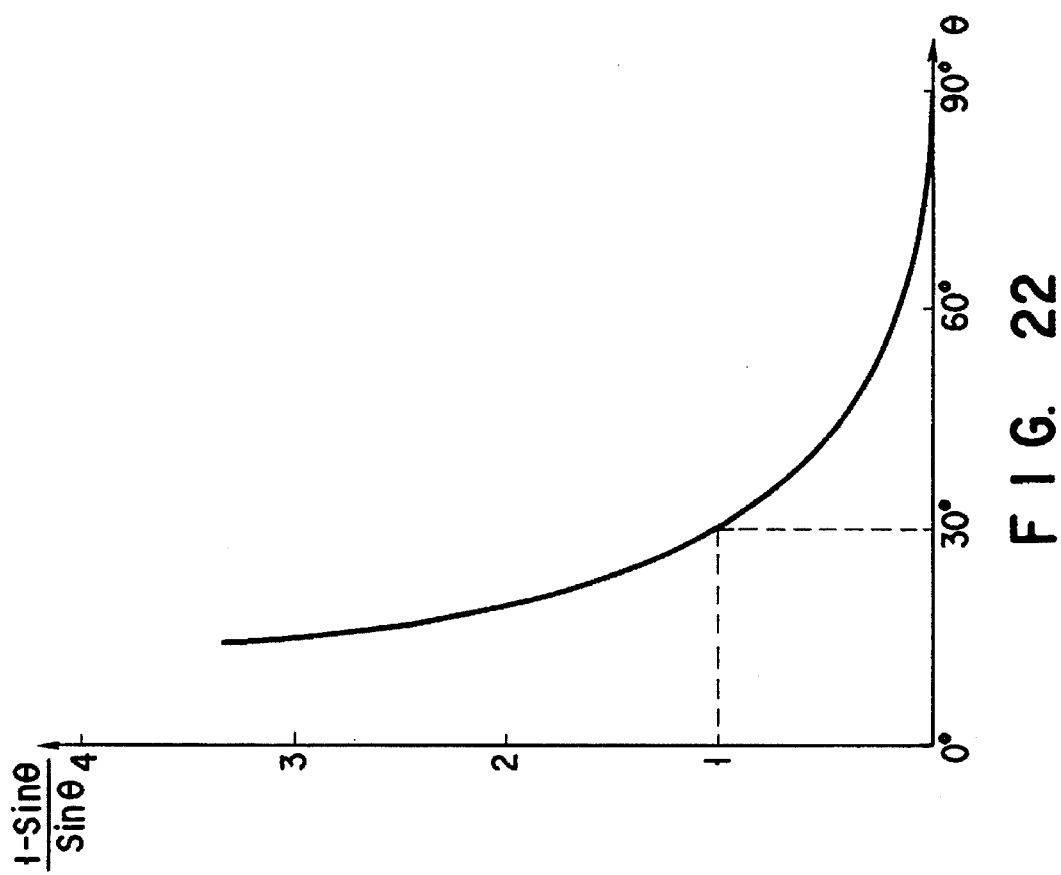
FIG. 22 is a graph which explains the relation between the formula (2) and the angle θ in the sixth embodiment.

However, the length of the non-contact region is increased by the same length equal to the value expressed by the formula (2). Here, the term of $(1-\sin\theta)/\sin\theta$ decreases in proportion to the angle θ, as shown in FIG. 22. Therefore, a larger angle θ is more effective form the view point of decreasing the value expressed by the formula (2). A range of 30°≦θ is selected as a value preferable for the angle θ on the basis of FIG. 22, so as to satisfy a relation of $(1-\sin\theta)/\sin\theta \leq 1$, on the basis of FIG. 22.

On the other hand, the length for which the contact region of the source wiring oppose the contact region of the drain wiring is obtained from the following formula (3):

$$\text{Length for which both contact regions oppose each other} = \frac{x}{\tan\theta} \quad (3)$$

Figure 23:
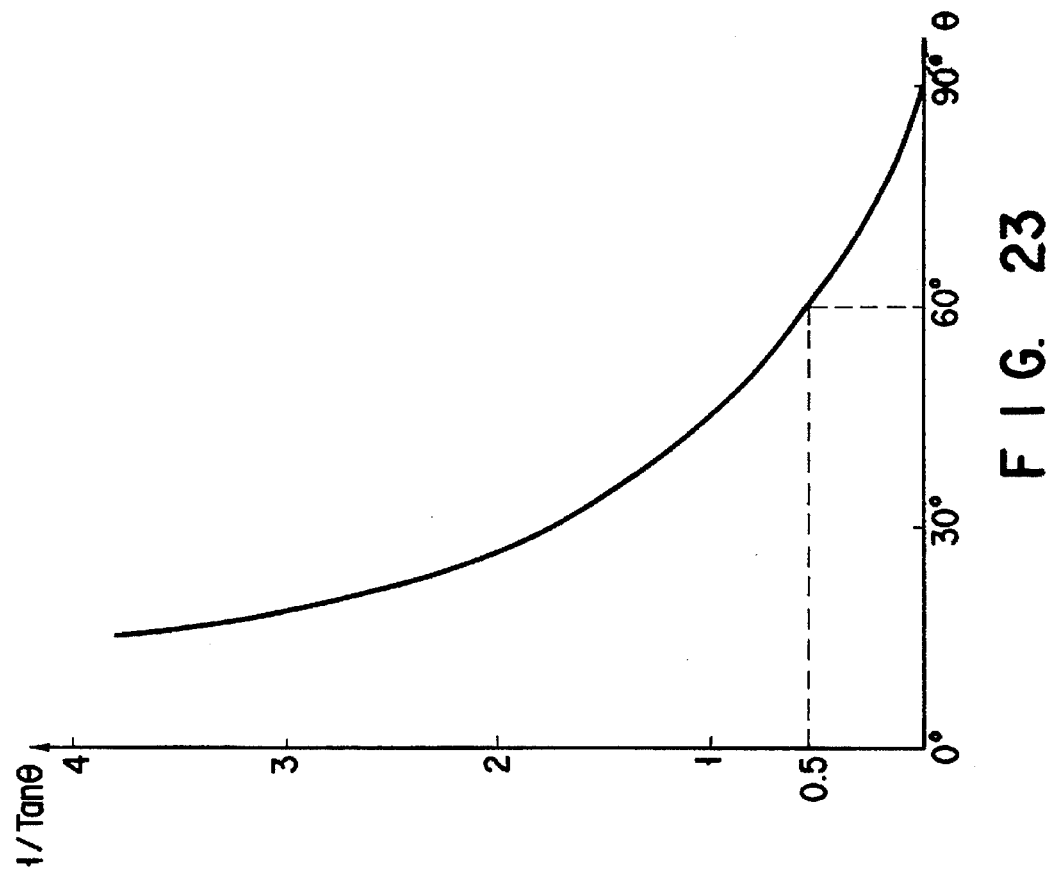
FIG. 23 is a graph which explains the relation between the formula (3) and the angle θ in the sixth embodiment.

The greater the length for which both contact regions oppose each other is, the smaller the resistance is. Therefore, a greater length is effective. Here, 1/tanθ decreases in proportion to the angle θ, as shown in FIG. 23. As a result, a smaller angle θ is preferable from the view point of increasing the value of formula (3). For example, a range of θ≦60° is selected as a value preferable for the angle θ, so as to satisfy 1/tanθ≧0.5, on the basis of FIG. 23.

From the above, the preferable range of the angle θ is 30°≦θ≦60°. Thus, the same advantages as obtained in the first embodiment can be obtained in the two-layer structure SD wiring pattern having an arbitrary angle θ within the range of 30° to 60°. Likewise, any of the wiring patterns according to the second to fifth embodiments can be modified such that the angle θ satisfies the range of 30°≦θ≦60, and in any of those modifications, the same effects as obtained in corresponding embodiments can be attained.

In the next, a specific method of forming a high withstand voltage MOSFETs according to the above embodiments will be explained with reference to cross-sections in forming steps.

Figure 10A:
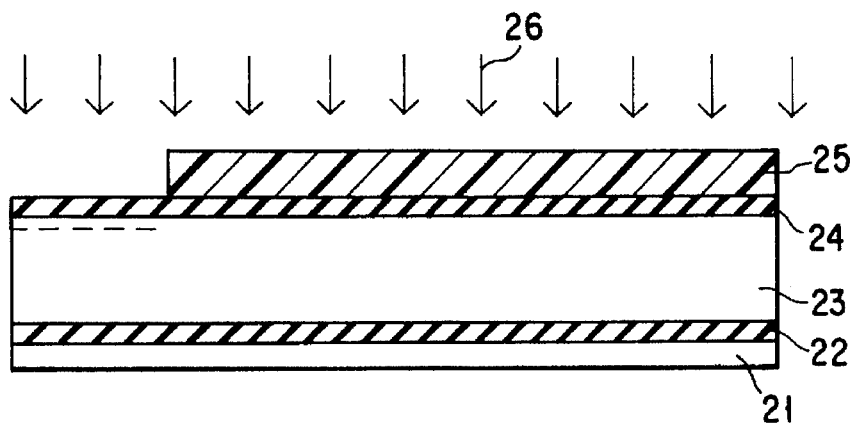
FIGS. 10A is a cross-section showing steps of first half of a method of forming a high withstand voltage MOSFET.

At first, as shown in FIG. 10A, a high resistance p- or n-type semiconductor substrate or an SOI substrate consisting of a substrate 21, an oxide film 22 and an active film 23 is prepared, and an oxide film 24 is formed on the surface of the active layer 23. Thereafter, a resist pattern 25 is formed on the oxide film 24, and ion-implantation of boron 26 is performed, with the resist pattern 25 as a mask.

Figure 10B:
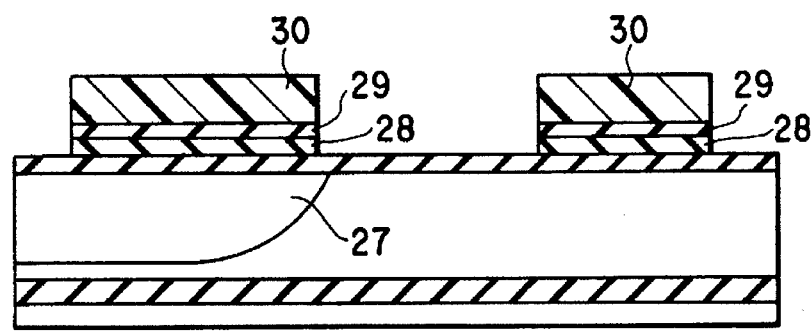
FIGS. 10B is a cross-section showing steps of first half of a method of forming a high withstand voltage MOSFET.

As a result, a p-type base layer 27 is formed as shown in FIG. 10B. Thereafter, the resist pattern 25 is removed. Subsequently, an oxide film which becomes an oxide film 28 and a nitride film which becomes a nitride film 29 are sequentially deposited on the entire surface, as is also shown in FIG. 10B. Thereafter, a resist pattern 30 is formed, and the oxide film and nitride film described above are subjected to etching with the resist pattern 30 used as a mask, thereby to form the oxide film 28 and the nitride film 29. Then, the resist pattern 30 is removed.

Figure 10C:
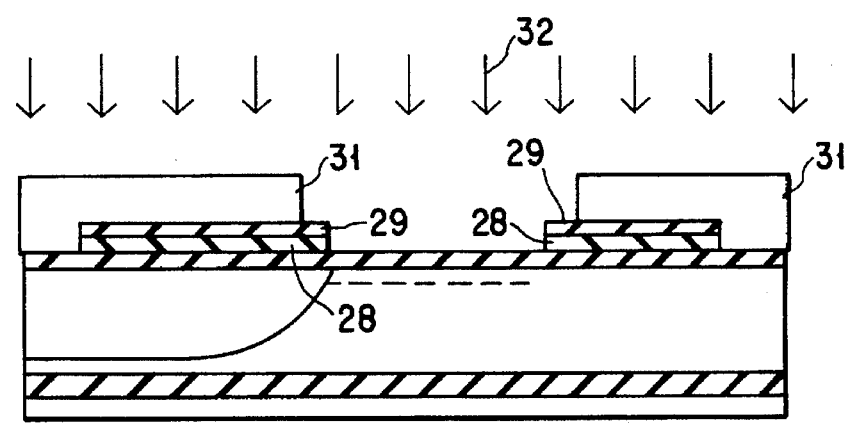
FIGS. 10C is a cross-section showing steps of first half of a method of forming a high withstand voltage MOSFET.

In the next, as shown in FIG. 10C, a resist pattern 31 is formed, and thereafter, ion-implantation of phosphorus 32 is performed under condition of using a dose amount of 2 to $5 \times 10^{12}$ cm$^{-2}$, with the resist pattern 31, the oxide film 28, and the nitride film 29 used as masks.

Figure 10D:
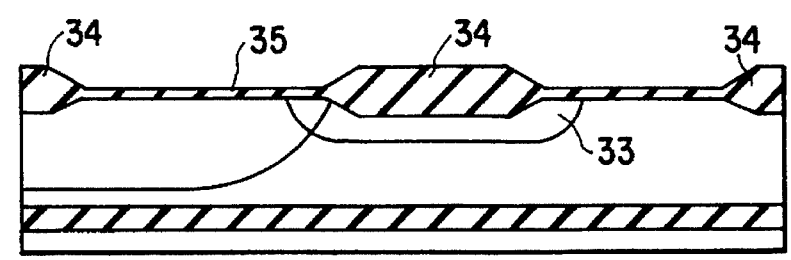
FIGS. 10D is a cross-section showing steps of first half of a method of forming a high withstand voltage MOSFET.

Subsequently, as shown in FIG. 10D, a field oxide film 34 having a thickness of about 800 nm is formed by a LOCOS method. In this step, phosphorus 32 is diffused thereby forming an n-type drift layer 33 of a low density having a thickness of about 1 to 1.5 μm, by a heat treatment taken when forming the field oxide film 34. Thereafter, the resist pattern 31, the oxide film 28, and the nitride film 29 are removed.

Figure 11A:
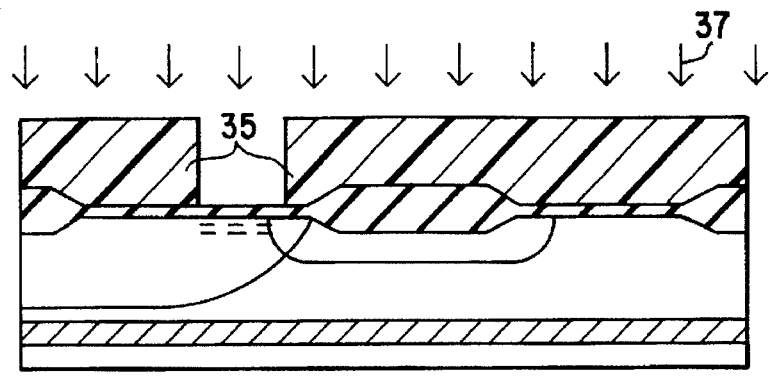
FIG. 11A is a cross-section showing steps of last half of the method of forming a high withstand voltage MOSFET.

Then, as shown in FIG. 11A, a resist pattern 35 is formed, and thereafter, ion-implantation of boron 37 is performed under condition of using a dose amount of 2 to $5 \times 10^{12}$ cm$^{-2}$ to adjust the threshold voltage of the MOSFET. Thereafter, the resist pattern 35 is removed.

Figure 11B:
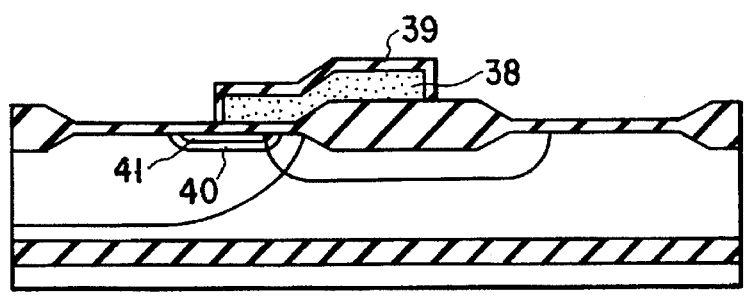
FIG. 11B is a cross-section showing steps of last half of the method of forming a high withstand voltage MOSFET.

In the next, as shown in FIG. 11B, a gate electrode 38 made of polysilicon is formed. This gate electrode 35 extends over a field oxide film 34, and the portion of the gate electrode 35 which is situated above the field oxide film 34 serves as a field plate which reduces the strength of an electric field at the drain end of the gate electrode 35. Thereafter, an oxide film 39 is formed by thermal oxidation. Boron 37 described above is diffused by a heat treatment taken when performing this oxidization, thereby forming channel layers 40 and 41.

Figure 11C:
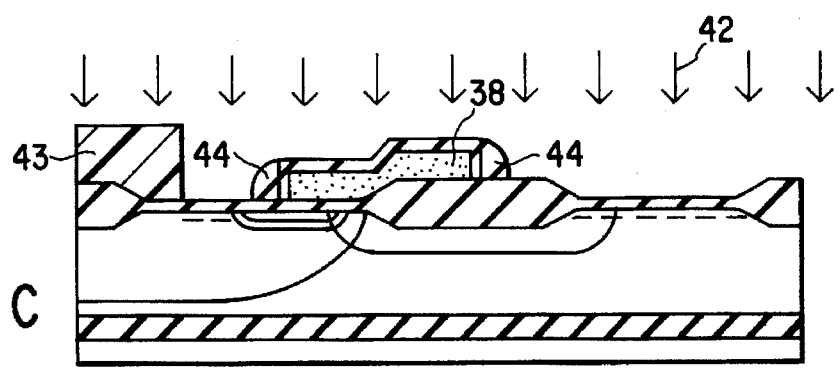
FIG. 11C is a cross-section showing steps of last half of the method of forming a high withstand voltage MOSFET.

Then, as shown in FIG. 11C, a resist pattern 43 and an LDD 44 are formed, and thereafter, ion-implantation of phosphorus 42 is performed. In this step, an n-type source layer 50 of a high density is formed with the source end of the gate electrode used as an edge, while an n-type drain layer 51 of a high density is formed by an opening portion of the field oxide film 34, in a self-alignment. Thereafter, the resist pattern 43 is removed.

Figure 11D:
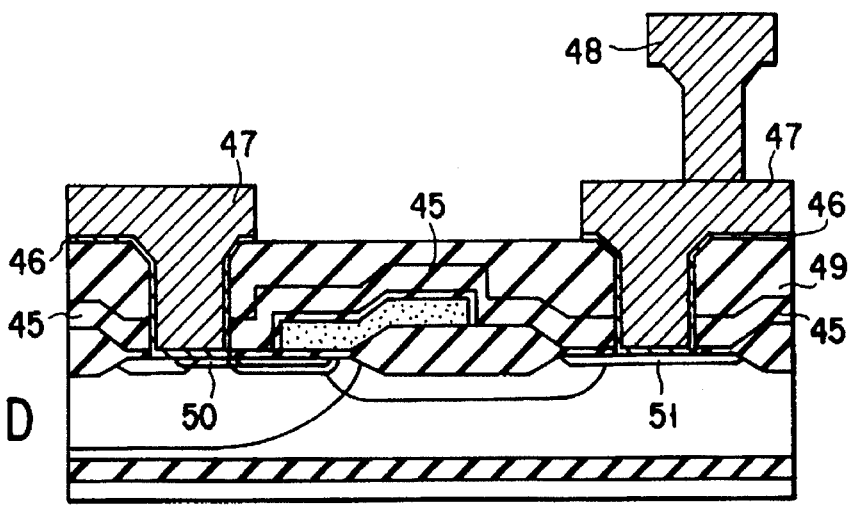
FIG. 11D is a cross-section showing steps of last half of the method of forming a high withstand voltage MOSFET.
Figure 12:
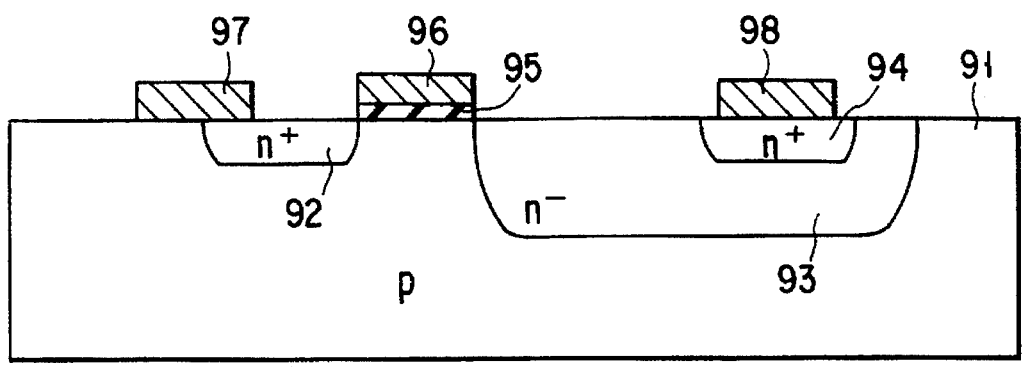
FIG. 12 is a cross-section showing an element structure of a conventional lateral type MOSFET.
Figure 13:
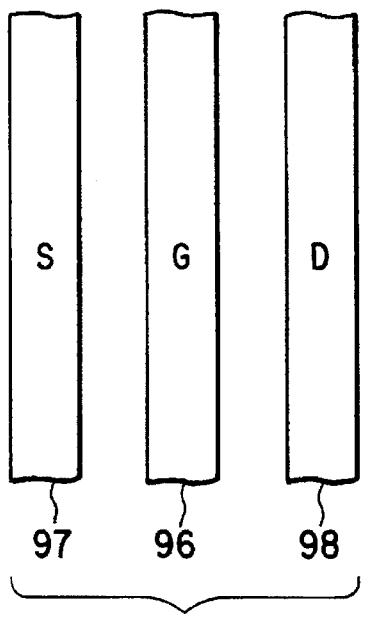
FIG. 13 is a plan view showing a stripe pattern.
Figure 14:
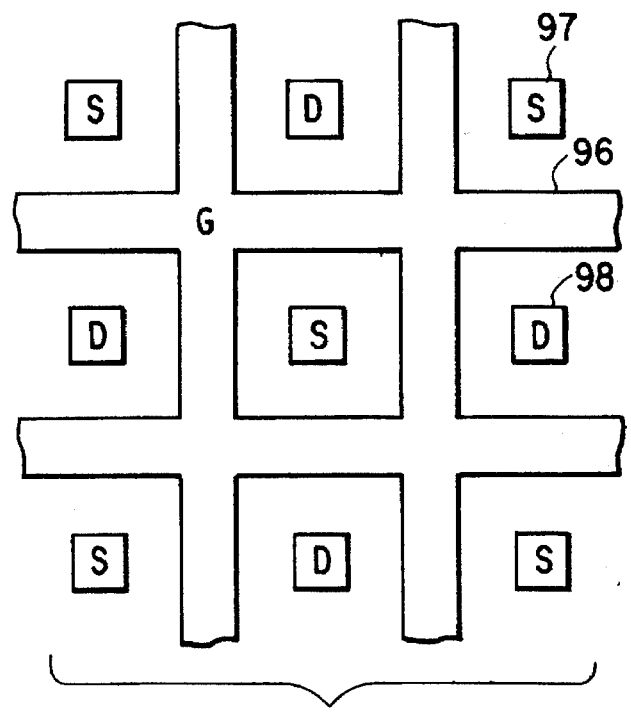
FIG. 14 is a plan view showing a mesh pattern.

At last, as shown in FIG. 11D, an inter-layer insulating film 45, an insulating film 49, and a Ti/TiN film 46 are formed, and these films are subjected to etching to open contact holes. Thereafter, a first Al electrode (a source electrode and a drain electrode) 47, and a second inter-layer insulating film not shown are formed, and then, through-holes are opened. Further, a second Al electrode 48 is formed, and the MOSFET is thereby completed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A MOS gate type semiconductor device, comprising:
a semiconductor substrate on a surface of which a source region and a drain region are formed;
an upper source wiring provided on the semiconductor substrate consisting of a plurality of upper source electrodes formed in a comb-like arrangement;
an upper drain wiring provided on the semiconductor substrate consisting of a plurality of upper drain electrodes formed in a comb-like arrangement such that the plurality of upper drain electrodes are engaged with the upper source electrodes;
lower source electrodes provided at each of lower portions of adjacent pairs of the upper source electrodes and the upper drain electrodes such that the lower source electrodes are layered below the upper source electrodes and the upper drain electrodes; and
lower drain electrodes provided at each of lower portions of adjacent pairs of the upper source electrodes and the upper drain electrodes such that the lower drain electrodes are layered below the upper source electrodes and the upper drain electrodes,
wherein the lower source electrodes are connected to the upper source electrodes and the source region, and are disposed so as to form a wave-like shape extending in a direction in which the upper source electrodes are disposed, and
the lower drain electrodes are connected to the upper drain electrodes and the drain region, and are disposed so as to form a wave-like shape extending in a direction in which the upper drain electrodes are disposed, in parallel with the lower source electrodes.

2. A MOS gate type semiconductor device, comprising:
a semiconductor substrate on a surface of which a source region and a drain region are formed;
an upper source wiring provided on the semiconductor substrate consisting of a plurality of upper source electrodes formed in a comb-like arrangement;
an upper drain wiring provided on the semiconductor substrate and consisting of a plurality of upper drain electrodes formed in a comb-like arrangement such that the plurality of upper drain electrodes are engaged with the upper source electrodes;
lower source electrodes provided at each of lower portions of adjacent pairs of the upper source electrodes and the upper drain electrodes such that the lower source electrodes are layered below the upper source electrodes and the upper drain electrodes; and
lower drain electrodes provided at each of lower portions of adjacent pairs of the upper source electrodes and the upper drain electrodes such that the lower drain electrodes are layered below the upper source electrodes and the upper drain electrodes,
wherein the lower source electrodes are connected to the upper source electrodes and the source region, and are disposed so as to form a wave-like shape extending in a lengthwise direction of the upper source electrodes, and
the lower drain electrodes are connected to the upper drain electrodes and the drain region, and are disposed so as to form a wave-like shape extending in a lengthwise direction of the upper drain electrodes, in parallel with the lower source electrodes.

3. A MOS gate type semiconductor device, according to claim 1, wherein those of the lower source electrodes disposed to form the wave-like shape, which are connected to a same source region and are adjacent to each other, are formed to be integral with each other, and those of the lower drain electrodes disposed to form the wave-like shape, which are connected to a same drain region and are adjacent to each other, are formed to be integral with each other.

4. A MOS gate type semiconductor device, according to claim 2, wherein those of the lower source electrodes disposed to form the wave-like shape, which are connected to a same source region and are adjacent to each other, are formed to be integral with each other, and those of the lower drain electrodes disposed to form the wave-like shape, which are connected to a same drain region and are adjacent to each other, are formed to be integral with each other.

5. A MOS gate type semiconductor device, according to claim 1, wherein the lower source electrodes are disposed such that the lower source electrodes have a lengthwise direction oblique at an angle of 30° to 60° to a lengthwise direction of the upper source electrodes.

6. A MOS gate type semiconductor device, according to claim 2, wherein the lower source electrodes are disposed such that the lower source electrodes have a lengthwise direction oblique at an angle of 30° to 60° to a lengthwise direction of the upper source electrodes.

7. A MOS gate type semiconductor device, according to claim 1, wherein the lower drain electrodes are disposed such that the lower drain electrodes have a lengthwise direction oblique at an angle of 30° to 60° to a lengthwise direction of the upper drain electrodes.

8. A MOS gate type semiconductor device, according to claim 2, wherein the lower drain electrodes are disposed such that the lower drain electrodes have a lengthwise direction oblique at an angle of 30° to 60° to a lengthwise direction of the upper drain electrodes.

9. A MOS gate type semiconductor device, according to claim 1, wherein a contact area of a portion where one of the lower source electrodes is layered below one of the upper source electrodes is equal to a contact area of a portion where another one of the lower source electrodes is layered below another one of the upper source electrodes, and a contact area of a portion where one of the lower source electrodes is layered below one of the upper drain electrodes is equal to a contact area of a portion where one of the source electrodes is layered below one of the drain electrodes.

10. A MOS gate type semiconductor device, according to claim 2, wherein a contact area of a portion where one of the lower source electrodes is layered below one of the upper source electrodes is equal to a contact area of a portion where another one of the lower source electrodes is layered below another one of the upper source electrodes, and a contact area of a portion where one of the lower source electrodes is layered below one of the upper drain electrodes is equal to a contact area of a portion where one of the source electrodes is layered below one of the drain electrodes.

11. A MOS gate type semiconductor device, according to claim 1, wherein a contact area of a portion where one of the lower drain electrodes is layered below one of the upper drain electrodes is equal to a contact area of a portion where another one of the lower source electrodes is layered below another one of the upper source electrodes, and a contact area of a portion where one of the lower drain electrodes is layered below one of the upper source electrodes is equal to a contact area of a portion where another one of the lower drain electrodes is layered below another one of the upper source electrodes.

12. A MOS gate type semiconductor device, according to claim 2, wherein a contact area of a portion where one of the lower drain electrodes is layered below one of the upper drain electrodes is equal to a contact area of a portion where another one of the lower source electrodes is layered below another one of the upper source electrodes, and a contact area of a portion where one of the lower drain electrodes is layered below one of the upper source electrodes is equal to a contact area of a portion where another one of the lower drain electrodes is layered below another one of the upper source electrodes.

13. A MOS gate type semiconductor device, comprising:

a semiconductor substrate on a surface of which a source region and a drain region are formed;

an upper source wiring provided on the semiconductor substrate consisting of a plurality of upper source electrodes formed in a comb-like arrangement;

an upper drain wiring provided on the semiconductor substrate consisting of a plurality of upper drain electrodes formed in a comb-like arrangement such that the plurality of upper drain electrodes are engaged with the upper source electrodes;

lower source electrodes provided at each of lower portions of adjacent pairs of the upper source electrodes and the upper drain electrodes such that the lower source electrodes are layered below the upper source electrodes and the upper drain electrodes; and lower drain electrodes provided at each of lower portions of adjacent pairs of the upper source electrodes and the upper drain electrodes such that the lower drain electrodes are layered below the upper source electrodes and the upper drain electrodes, wherein the lower source electrodes are connected to the upper source electrodes and the source region, and have a lengthwise direction oblique to a lengthwise direction of the upper source electrodes, and the lower drain electrodes are connected to the upper drain electrodes and the drain region, and are formed to be disposed alternately in parallel with the lower source electrodes.

* * * * *